(12) United States Patent
Kuroda

(10) Patent No.: US 10,714,674 B2
(45) Date of Patent: Jul. 14, 2020

(54) PIEZOELECTRIC DEVICE AND BASE

(71) Applicant: NIHON DEMPA KOGYO CO., LTD., Tokyo (JP)

(72) Inventor: Tomotaka Kuroda, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 354 days.

(21) Appl. No.: 15/815,717

(22) Filed: Nov. 17, 2017

(65) Prior Publication Data

US 2018/0145243 A1    May 24, 2018

(30) Foreign Application Priority Data

Nov. 24, 2016 (JP) ................... 2016-227866

(51) Int. Cl.
*H01L 41/053* (2006.01)
*H03H 9/10* (2006.01)

(52) U.S. Cl.
CPC ......... *H01L 41/053* (2013.01); *H03H 9/1021* (2013.01); *H01L 2924/16195* (2013.01); *H03H 9/10* (2013.01)

(58) Field of Classification Search
CPC .. H01L 41/053; H03H 9/1021; H03H 9/1007; H03H 9/1014
USPC ................................... 310/344, 348
See application file for complete search history.

(56) References Cited

U.S. PATENT DOCUMENTS

2013/0049543 A1* 2/2013 Amano ................. H03H 9/171
310/344

FOREIGN PATENT DOCUMENTS

JP    2016178628    10/2016

* cited by examiner

*Primary Examiner* — Derek J Rosenau
(74) *Attorney, Agent, or Firm* — JCIPRNET

(57) ABSTRACT

A piezoelectric device includes a base, a piezoelectric vibrating piece, and a cover. The base has a depressed portion and a bank portion. The piezoelectric vibrating piece is housed within the depressed portion. The cover is bonded on a top surface of the bank portion of the base with a sealing metal. The top surface of the base has an inclined surface that inclines down toward an inside of the base in a direction along a width direction of the bank portion or an inclined surface that inclines down toward an outside of the base in the direction along the width direction of the bank portion.

5 Claims, 4 Drawing Sheets

PIEZOELECTRIC DEVICE AND BASE

CROSS-REFERENCE TO RELATED APPLICATIONS

This application is based on and claims priority under 35 U.S.C. § 119 to Japanese Patent Application No. 2016-227866, filed on Nov. 24, 2016, the entire content of which is incorporated herein by reference.

TECHNICAL FIELD

This disclosure relates to a piezoelectric device and a base preferably used for fabricating the same.

DESCRIPTION OF THE RELATED ART

In various electronic equipment such as mobile phones and personal computers, piezoelectric devices such as a crystal unit and a crystal controlled oscillator are often used to select and/or control frequencies, for similar purposes.

This type of piezoelectric device includes a piezoelectric vibrating piece and a container that houses the piezoelectric vibrating piece. In the case of the crystal controlled oscillator, an oscillator circuit is additionally included. As a type of such a piezoelectric device, there is one whose container is constituted of a base and a cover. The base has a depressed portion to house the piezoelectric vibrating piece and a bank portion surrounding the depressed portion. The cover is welded to the base with a sealing metal, such as gold tin, on a top surface of the bank portion. For example, paragraph 52 and FIG. 1 in Japanese Unexamined Patent Application Publication No. 2016-178628 disclose a piezoelectric device that includes a ceramic base having a depressed portion and a bank portion and a cover that is bonded to this base with a sealing metal, such as gold tin, on a top surface of the bank portion. In this piezoelectric device, the cover is made of kovar, and gold tin alloy is formed to be in a frame shape in an edge region on a surface of the cover. In the ceramic base, although it is not clearly specified, a metallized portion is formed on the top surface of the bank portion. The cover is bonded on this metallized portion with the gold tin alloy. The piezoelectric device with the above-described structure, which is sealed with the sealing metal, has advantages, such as easily lowering a profile and easily reducing a size, compared with ones with other sealing methods.

In this type of piezoelectric device, in order to maintain its characteristics, an inside of the container is required to be maintained to be a predetermined low-pressure atmosphere or a predetermined inert gas atmosphere. Therefore, reliability of sealing is important. As downsizing of the piezoelectric device improves, a width of the bank portion of the base gets narrowed. As a result, a sealing path (seal path) gets narrowed. Various kinds of techniques to ensure the reliability of sealing even when the seal path is narrowed become more and more necessary.

For example, in the case where the sealing metal described above is used, conventionally, it has been employed a structure in which an outer shape of the cover is slightly downsized with respect to an outer shape of the base to cause an end portion of the cover to be backed off from an end portion of the base. Then, it has been employed a structure in which the top surface of the base and a back surface of the cover are bonded with the sealing metal and the sealing metal is applied around a side surface of the cover in the back-off portion to reinforce the side surface of the cover with the sealing metal by what is called a fillet structure, in order to enhance the reliability of sealing. However, as narrowing of the seal path improves, ensuring the above-described back-off portion itself becomes difficult. Some sort of countermeasure is required.

A need thus exists for a piezoelectric device and a base which are not susceptible to the drawback mentioned above.

SUMMARY

According to an aspect of this disclosure, there is provided a piezoelectric device that includes a base, a piezoelectric vibrating piece, and a cover. The base has a depressed portion and a bank portion. The piezoelectric vibrating piece is housed within the depressed portion. The cover is bonded on a top surface of the bank portion of the base with a sealing metal. The top surface of the base has: an inclined surface that inclines down toward an inside of the base in a direction along a width direction of the bank portion, or an inclined surface that inclines down toward an outside of the base in the direction along the width direction of the bank portion.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
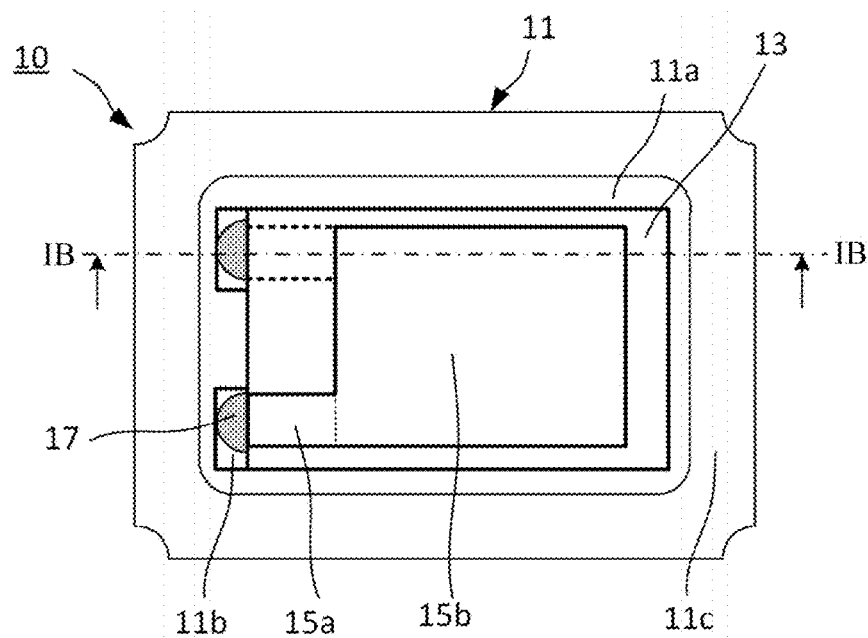
FIG. 1A to FIG. 1D are explanatory drawings of a piezoelectric device 10 according to an embodiment.

The following describes an embodiment of this disclosure with reference to the drawings. Each drawing used in the descriptions is merely illustrated schematically for understanding the disclosure. In each drawing used in the descriptions, like reference numerals designate corresponding or identical elements, and therefore such elements will not be further elaborated here. Shapes, dimensions, materials, and a similar factor described in the following embodiment are merely preferable examples within the scope of the disclosure. Therefore, the disclosure is not limited to only the following embodiment.

1. EMBODIMENT OF PIEZOELECTRIC DEVICE AND BASE

Figure 1B:
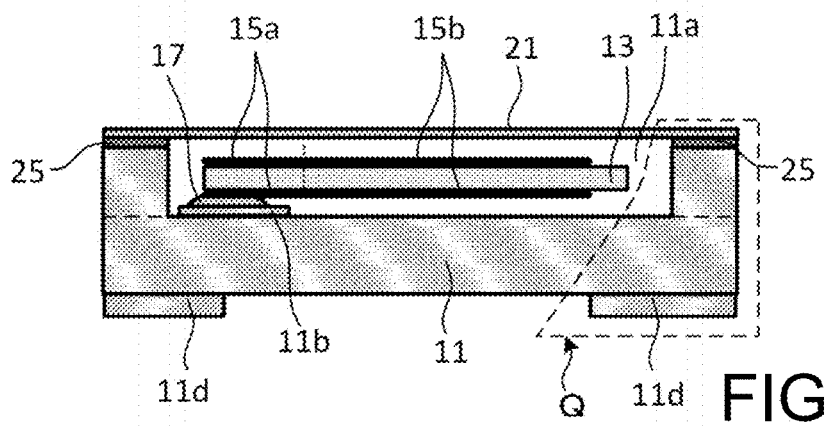
Figures 1C, 1D:
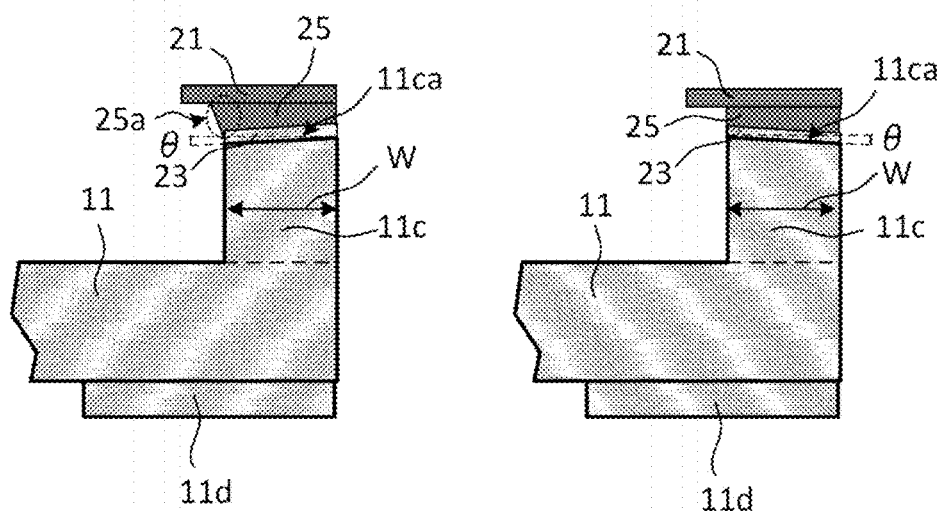

FIG. 1A is a plan view describing a piezoelectric device 10 and a base 11 according to an embodiment. FIG. 1B is a sectional drawing of the piezoelectric device 10 along a line IB-IB in FIG. 1A. FIG. 1C and FIG. 1D are sectional drawings illustrating a part Q in FIG. 1A enlarged. Note that, in FIG. 1A, a cover is not illustrated. FIG. 1C and FIG. 1D are for describing two configurations having different inclination directions of a top surface 11ca (which is also referred to as "inclined surface 11ca" and its details will be described later).

The piezoelectric device 10 according to this embodiment includes the base 11, a crystal element 13 as a piezoelectric vibrating piece 13, and a cover 21. The piezoelectric vibrating piece 13 is, for example, an AT-cut quartz crystal piece or an SC-cut quartz crystal piece. The crystal element 13 has a planar shape in a rectangular shape. The crystal element 13 may have other modes of vibration, such as a tuning-fork type quartz crystal piece.

The base 11 is made of, for example, ceramics. This base 11 includes a depressed portion 11a, connection bumps 11b, and a bank portion 11c. The depressed portion 11a has an opening wider than the planar shape of the piezoelectric vibrating piece 13. The connection bumps 11b are disposed on an inner bottom surface of this depressed portion 11a and are for connecting the piezoelectric vibrating piece. The bank portion 11c forms the depressed portion 11a. Furthermore, this base 11 includes mounting terminals 11d and a via wiring (not illustrated). The mounting terminals 11d are disposed at a bottom surface outside the base 11. The via wiring connects this mounting terminal 11d and the connection bump 11b. The base 11 and the depressed portion 11a have planar shapes in rectangular shapes.

Furthermore, in this base 11, the top surface 11ca of the bank portion 11c has an inclined surface (an example in FIG. 1C) that inclines down toward an inside of the base 11 in a direction along a width W direction of the bank portion 11c, or an inclined surface (an example in FIG. 1D) that inclines down toward an outside of the base 11 in the direction along the width W direction of the bank portion 11c. The inclined surface 11ca inclines at an angle of θ that is provided by a horizontal surface and the inclined surface 11ca.

When this angle θ is too small, effects of this disclosure cannot be obtained. When this angle θ is too large, a contact of the inclined surface 11ca and a surface of the cover 21 cannot be performed properly. Therefore, according to an inventor's experiment and examination, this angle θ should be two degrees≤θ≤six degrees, more preferably, two degrees≤θ≤five degrees, further more preferably, three degrees≤θ≤five degrees.

The top surface 11ca is a surface of ceramics; therefore, a sealing metal cannot be directly bonded on the surface. Accordingly, a metallized layer 23 is disposed by a well-known technique.

On the other hand, the cover 21 is constituted of a plate body and for example, a gold tin layer 25 as a sealing metal 25. The plate body is in a plate shape and formed of a preferred material, such as kovar. The gold tin layer 25 as the sealing metal 25 is in a frame shape in plan view and disposed on an edge portion of this plate body.

The piezoelectric vibrating piece 13 includes excitation electrodes 15a and extraction electrodes 15b on front and back principal surfaces. This piezoelectric vibrating piece 13 is connected and fixed to the connection bumps 11b at a position of the extraction electrode 15b with a conductive adhesive 17 within the depressed portion 11a of the base 11.

On a top surface (inclined surface) 11ca of the bank portion 11c of the base 11 in which the piezoelectric vibrating piece 13 is mounted, the cover 21 is bonded with the gold tin layer 25. Thus, the piezoelectric vibrating piece 13 is sealed within the container. An actual sealing is achieved by putting the base 11 in which the piezoelectric vibrating piece 13 is mounted and the cover 21 in which the sealing metal 25 is formed in a stacked state into a heating furnace and melting the sealing metal 25 to bond the cover 21 and the top surface 11ca (actually, the metallized layer 23 formed along the top surface) of the base 11.

With the piezoelectric device 10 and the base 11 according to the disclosure, as illustrated in FIG. 1C and FIG. 1D, an accumulation of the sealing metal 25 between the top surface 11ca (inclined surface) of the base 11 and the cover 21 is generated more than a situation without the inclined surface. Therefore, for example, a thickness of the sealing metal 25 is thickened. This can be considered that a buffer effect by the sealing metal 25 is obtained, thereby achieving an improved impact resistance of bonding between the cover 21 and the base 11 and an improved bonding strength. Especially, in the case where the inclined surface 11ca inclines down toward the inside of the base 11 (the case of the configuration in FIG. 1C), a structure in which the sealing metal 25 projects out from an end inside the base 11 of the base top surface to a back surface of the cover 21, like a corner edge structure 25a, can be generated, thereby ensuring achieving a further improved bonding strength between the cover 21 and the base 11.

2. WORKING EXAMPLE AND COMPARATIVE EXAMPLE

Next, the following describes results of comparison of strength between a crystal unit experimentally produced to have the top surface of the base providing the inclined surface as described in the disclosure (hereinafter, a working example), and a crystal unit experimentally produced to have the top surface of the base providing a horizontal surface (hereinafter, a comparative example). The following describes results of observing lapped surfaces after the respective samples of the working example and the comparative example are cross-sectionally lapped, such that the structure near the top surface is seen.

Conditions with which these samples are experimentally produced are similar for both the working example and the comparative example, except that the top surface of the base has the inclined surface or not. For example, the cover 21 is a plate body made of kovar applied with nickel/gold plating, and the sealing metal 25 is the gold tin alloy.

Figure 2A:
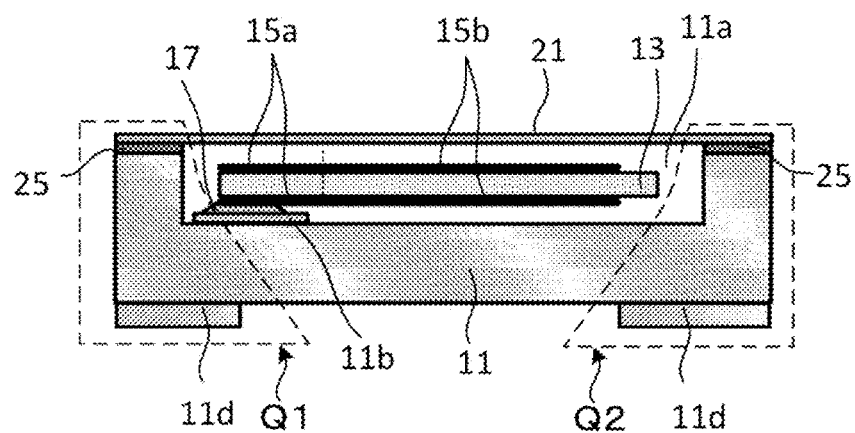
FIG. 2A and FIG. 2B are explanatory drawings of a piezoelectric device according to a working example.
Figure 2B:
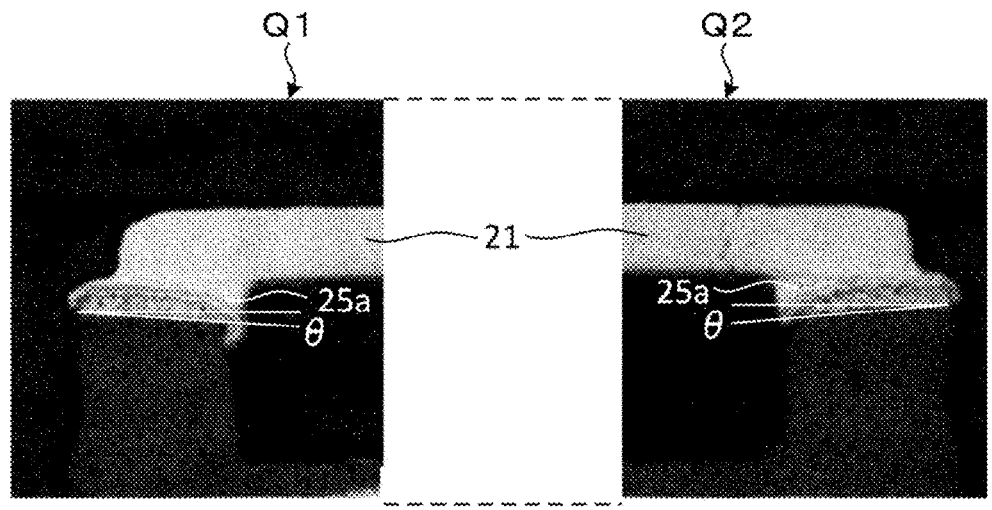
Figure 3A:
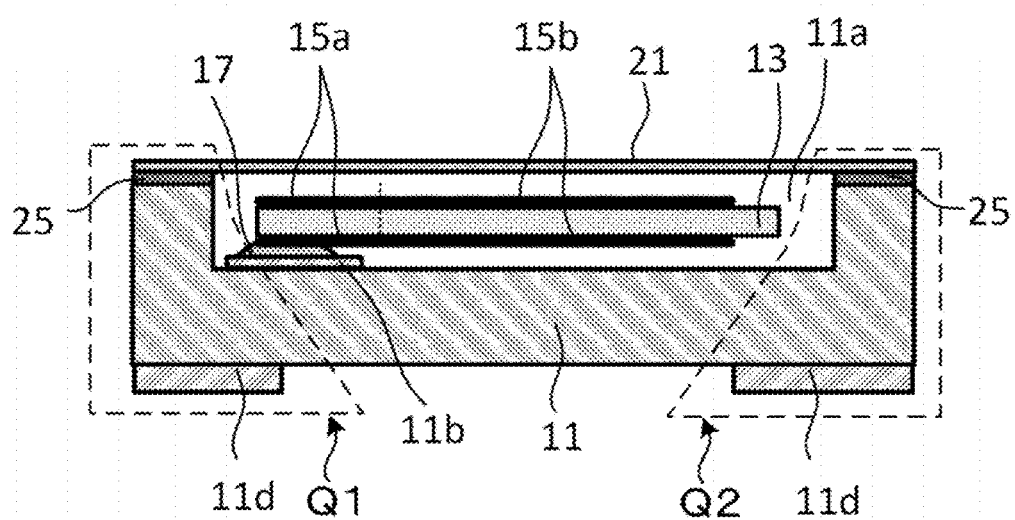
FIG. 3A and FIG. 3B are explanatory drawings of a piezoelectric device according to a comparative example.
Figure 3B:
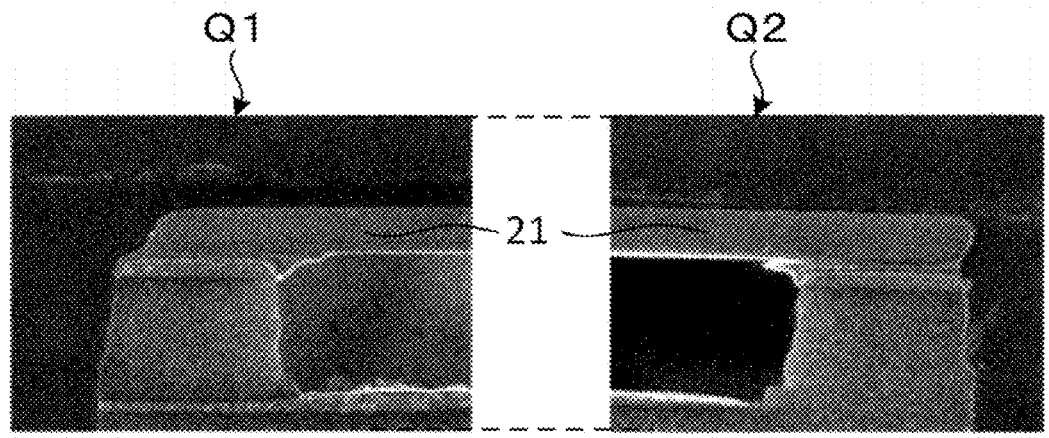

FIG. 2A, FIG. 2B, FIG. 3A and FIG. 3B are the explanatory drawings. In each of FIG. 2A, FIG. 2B, FIG. 3A and FIG. 3B, FIG. 2A and FIG. 3A are schematic diagrams of cross-sectional surfaces of the respective samples cross-sectionally lapped, and FIG. 2B and FIG. 3B are photographs observing the above-described respective cross-sectionally lapped products with an SEM (scanning electron microscope), and photographs that extract a part Q1 and a part Q2 in FIG. 2A and FIG. 3A.

An angle θ that inclines with respect to the horizontal surface of the top surface in the case of the working example is approximately three degrees. The top surface in the case of the comparative example is substantially the horizontal surface.

An examination of stripping off the cover 21 from the base 11 was performed for each of the working example and the comparative example. Then it was found that the working example is difficult to strip off compared with the comparative example. As is apparent from comparing the respective photographs in FIG. 2B and FIG. 3B, it can be seen that in the case of the working example, a structure in which the sealing metal 25 projects out from the end inside the base 11 of the top surface 11ca of the base 11 to the back surface of the cover 21 is provided. That is, it can be seen that the corner edge structure 25a is provided. This corner edge structure 25a is definitely an advantageous structure in improving the bonding strength between the cover 21 and the base 11; therefore, the effect of the disclosure can be understood.

While the embodiment of the piezoelectric device and the base according to this disclosure is described above, this disclosure is not limited to the above-described embodiment. For example, while in the above-described example, the description is made with an example of the crystal unit as the piezoelectric device, this disclosure is applicable to a crystal controlled oscillator, yet further to a piezoelectric resonator and a piezoelectric oscillator that use a piezoelectric material other than a crystal. While in the above-described embodiment, the gold tin alloy is used as the sealing metal, a sealing alloyed material may be another material.

Figure 4:
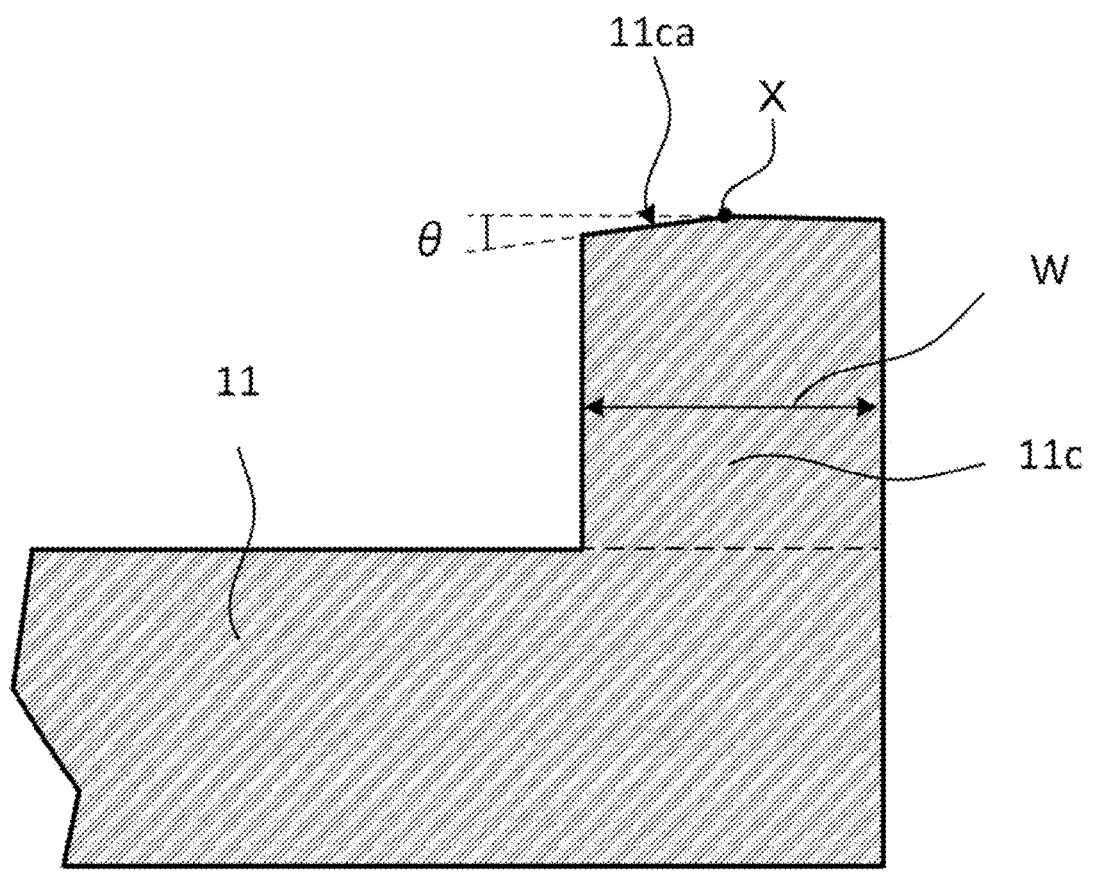
FIG. 4 is a supplemental explanatory drawing of an inclined surface of this disclosure.

In the above description, an example in which the inclined surface 11ca is disposed on a whole width W direction of the bank portion 11c on the top surface 11ca of the bank portion 11c of the base 11. That is, the inclined surface 11ca has a surface inclining across the whole width W direction using the end in the width W direction of the bank portion 11c as a starting point. However, as illustrated in FIG. 4, the inclined surface 11ca may provide a surface inclining using a midpoint X in the width W direction of the bank portion 11c as the starting point. This midpoint X can be any position that is designed so as to achieve an improved sealing quality, for example, a middle point in the width W direction of the bank portion 11c and a position at a predetermined proportion.

According to an aspect of this disclosure, there is provided a base made of ceramics. The base includes a depressed portion and a bank portion. The depressed portion houses a piezoelectric vibrating piece. The bank portion forms the depressed portion. The base has a top surface of the bank portion on which a cover is bonded via a sealing metal. The top surface has: an inclined surface that inclines down toward an inside of the base in a direction along a width direction of the bank portion, or an inclined surface that inclines down toward an outside of the base in the direction along the width direction of the bank portion.

With the piezoelectric device and the base according to the embodiment, a predetermined inclined surface is provided on the top surface of the bank portion of the base, thereby generating a region in which the sealing metal is easily accumulated between the cover and the top surface compared with a case without inclined surface. Therefore, the bonding strength between the cover and the base is enhanced. Especially in the case where the inclined surface inclines down toward the inside of the base, it is possible to generate the structure in which the sealing metal projects out from the end inside the base of the base top surface to the back surface of the cover (a structure like a corner edge; indicated by the reference numeral 25a in FIG. 1C and FIG. 2B). Therefore, it is more preferable in improving the bonding strength between the cover and the base. From these, with the piezoelectric device and the base according to this application, a reliability of sealing in a piezoelectric device can be improved.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device, comprising:
a base, having a depressed portion and a bank portion;
a piezoelectric vibrating piece, housed within the depressed portion; and
a cover, bonded on a top surface of the bank portion of the base with a sealing metal,
wherein the top surface of the base has:
an inclined surface that inclines down toward an inside of the base in a direction along a width direction of the bank portion, or
an inclined surface that inclines down toward an outside of the base in the direction along the width direction of the bank portion,
wherein the inclined surface inclines at an angle of $\theta$ that is provided by a horizontal surface and the inclined surface,
where two degrees$\leq\theta\leq$six degrees.

2. The piezoelectric device according to claim 1, wherein
the top surface has the inclined surface that inclines down toward the inside of the base in the direction along the width direction of the bank portion, and
the piezoelectric device has a corner edge structure in which the sealing metal projects out from an end inside the top surface of the base to a back surface of the cover.

3. The piezoelectric device according to claim 1, wherein the inclined surface is provided on a whole or a part of the top surface.

4. A base, comprising:
a depressed portion, in which a piezoelectric vibrating piece is housed; and
a bank portion that forms the depressed portion,
wherein the base has a top surface of the bank portion on which a cover is bonded via a sealing metal, and
the top surface has:
an inclined surface that inclines down toward an inside of the base in a direction along a width direction of the bank portion, or
an inclined surface that inclines down toward an outside of the base in the direction along the width direction of the bank portion,
wherein the inclined surface inclines at an angle of $\theta$ that is provided by a horizontal surface and the inclined surface,
where two degrees$\leq\theta\leq$six degrees.

5. The base according to claim 4, wherein
the inclined surface is provided on a whole or a part of the top surface.

* * * * *